United States Patent [19]

Bickerdike et al.

[11] Patent Number: 4,517,027
[45] Date of Patent: May 14, 1985

[54] BULK PRODUCTION OF ALLOYS BY DEPOSITION FROM THE VAPOR PHASE AND APPARATUS THEREFOR

[75] Inventors: Robert L. Bickerdike, Alton; Garyth Hughes, Farnham, both of England

[73] Assignee: The Secretary of State for Defence in Her Britannic Majesty's Government of the United Kingdom of Great Britain and Northern Ireland, Great Britain

[21] Appl. No.: 331,084

[22] Filed: Dec. 15, 1981

[30] Foreign Application Priority Data

Dec. 16, 1980 [GB] United Kingdom ................. 8040242

[51] Int. Cl.³ ...................... C23C 13/00; C23C 11/00
[52] U.S. Cl. ..................................... 148/6.3; 420/590; 420/566; 420/570; 427/250; 427/251; 118/730
[58] Field of Search ............. 75/135, 65 EB; 420/566, 420/570; 118/726, 728, 725, 730; 427/250, 251, 405; 219/121 L, 121 EB; 148/6, 6.3; 266/109, 110, 207, 209, 287, 44; 164/46, 82

[56] References Cited

U.S. PATENT DOCUMENTS

| | | | |
|---|---|---|---|
| 2,306,667 | 12/1942 | Smith | 420/566 |
| 2,915,384 | 12/1959 | Walsh | 48/715 X |
| 3,380,821 | 4/1968 | Harvey | 420/566 |
| 3,615,275 | 10/1971 | Turk et al. | 427/251 X |
| 3,895,671 | 7/1975 | Suzuki | 164/46 |
| 4,016,310 | 4/1977 | Ing | 427/251 |
| 4,231,982 | 11/1980 | Jansson | 164/46 X |
| 4,321,087 | 3/1982 | Levine et al. | 427/251 X |

FOREIGN PATENT DOCUMENTS

| | | |
|---|---|---|
| 1143077 | 4/1954 | Fed. Rep. of Germany . |
| 1176615 | 5/1962 | Fed. Rep. of Germany . |
| 53780 | 4/1977 | Japan ................... 148/6.3 |
| 1206586 | 9/1970 | United Kingdom . |
| 1387300 | 3/1973 | United Kingdom . |
| 618452 | 8/1978 | U.S.S.R. ................... 118/730 |

*Primary Examiner*—Brian E. Hearn
*Assistant Examiner*—David A. Hey
*Attorney, Agent, or Firm*—Cushman, Darby & Cushman

[57] ABSTRACT

A reuseable collector for use in a process for the bulk production of alloy by deposition from the vapor phase. The collector employs a coating of solder alloy on the deposition surface such that after deposition has been completed the solder alloy may be melted and the deposited alloy removed from the collector without the necessity of destroying the collector.

12 Claims, 4 Drawing Figures

BULK PRODUCTION OF ALLOYS BY DEPOSITION FROM THE VAPOR PHASE AND APPARATUS THEREFOR

BACKGROUND AND SUMMARY OF THE INVENTION

This invention relates to the bulk production of alloy material by deposition from the vapour phase and in particular to the removal of deposited alloy from a collector used in such a process.

Presently evaporated alloys are produced by deposition of alloy vapour from an evaporator onto a collector. In the process described in UK Patent Application No. 819956 the collector in the form of a rotating drum is positioned above the evaporator. Both the collector and the evaporator are housed within a vacuum or low pressure chamber. An unacceptable temperature rise at the surface of the deposited alloy is prevented by a combination of controlled cooling via the internal surface of the collector and also by control of the speed of rotation of the collector itself so that a particular area of the collector surface is not exposed over-long to the evaporating metal. Under conditions of controlled cooling and speed of rotation the collector is continuously rotated above the evaporator until the required thickness of deposit is obtained. The collector is then removed from the vacuum chamber and the collector itself machined from the deposited alloy using a boring tool. The remaining deposit is then cut into arcuate plates which may be formed into sheets by conventional metal working processes.

It will be appreciated that a major problem in such a process lies with the complete destruction of the collector. If the type of collector chosen for the process does not rely on gas-gap cooling assemblies for temperature control but on more conventional forms such as pipes carrying cooling fluid for example, then the interior of the collector drum will be far from a smooth bored cylinder and will in fact represent a major item of expenditure in terms of added value in machining time on attachment points for heaters, cooling pipes and heat conduction devices etc.

The present invention provides a collector which is re-usable and which may be removed and re-installed within the vacuum chamber without a requirement to completely dismantle and re-fit the supporting shafts and temperature control equipment.

According to the present invention a collector for use in a process for the bulk production of an alloy is coated with material having a melting temperature or temperature at which the onset of fusion occurs above the peak operating temperature at the deposition surface during operation of the process, such that on completion of deposition the material between the collector surface and the deposited alloy may be melted rendering the deposited alloy detachable from the collector.

According to a feature of the invention the collector is constructed such that minor movements of the deposited alloy due to localised thermal and mechanical stresses result in flexing of the collector surface and continuous metallurgical and thermal contact between the collector surface and the deposited alloy.

Preferably the melting temperature or temperature at which the onset of fusion occurs of the coating material is below the temperature at which the onset of rapid, irreversible precipitation reactions will occur within the deposited alloy.

The deposited alloy may be removed from the collector by cutting the alloy into discrete slabs prior to removal from the collector. The cutting operation may be assisted by the provision of grooves filled with the coating material in the deposition surface of the collector corresponding to paths traversed by a cutter, thereby avoiding damage to the collector surface by the cutter. Where the collector is a drum collector the grooves preferably extend axially between the drum ends so that the deposited alloy may be cut into arcuate plates.

The coating material is preferably a solder of the eutectic type, that is, having a melting/solidification temperature as opposed to a melting/solidification temperature range. The solder is preferably applied to the surface of the collector by a spraying process such as, for example, flame or plasma-arc spraying. Where the collector is manufactured from an aluminium based material it may be necessary for the collector surface to have an initial deposit of copper to allow 'wetting' by the subsequent solder coating.

BRIEF DESCRIPTION OF THE ACCOMPANYING DRAWINGS

An embodiment of the present invention will now be described by way of example only with reference to the following figures of which:

DETAILED DESCRIPTION OF THE PREFERRED EXEMPLARY EMBODIMENTS

Figure 1:
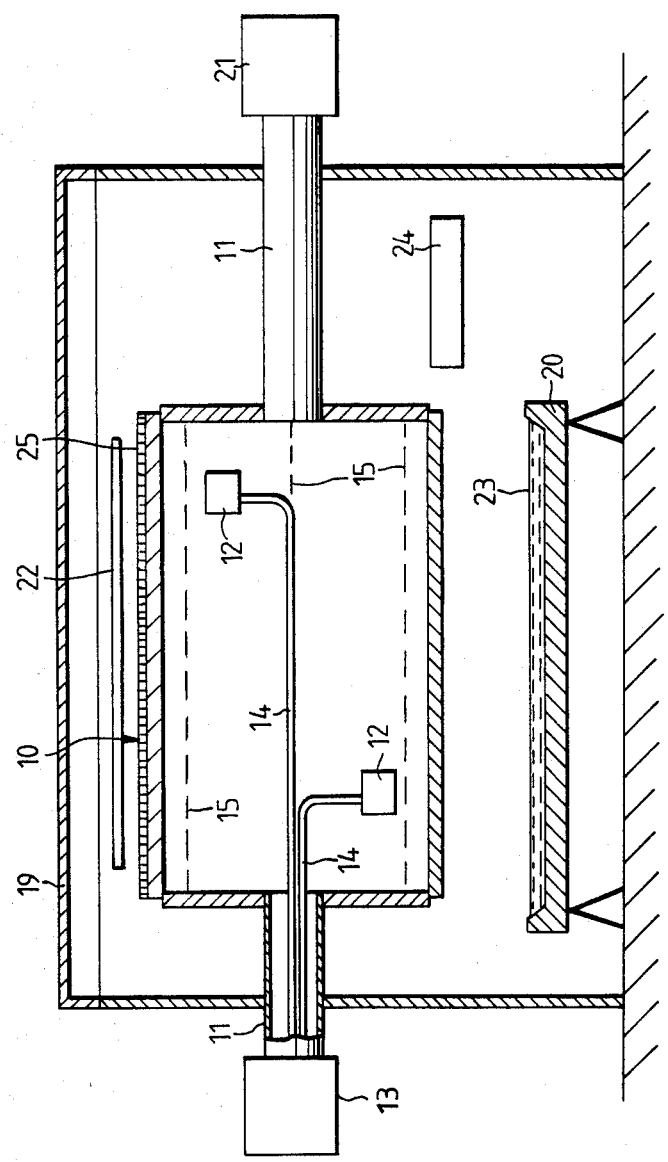
FIG. 1 shows a schematic sectional elevation of a drum collector positioned within the deposition apparatus.

Referring to FIG. 1 a collector drum 10, manufactured from an aluminium alloy, is mounted on stub shafts 11 and includes gas-gap cooling assemblies 12 for connection to a temperature control unit 13 by means of pipes 14.

Figure 2:
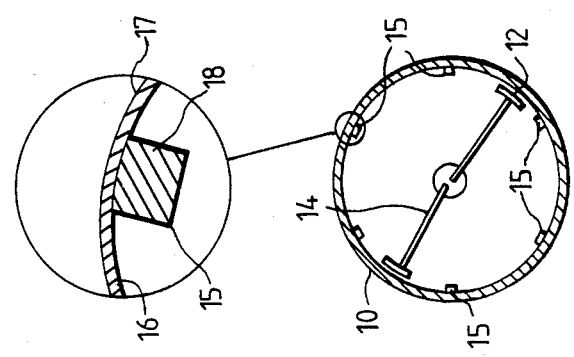
FIG. 2 shows a transverse section of the drum of FIG. 1 together with an enlarged view of the cutting grooves in the drum.

As shown by FIGS. 1 and 2 the drum 10 has six equi-spaced cutting grooves 15 therein which extend axially between the drum ends to facilitate the cutting of deposited alloy on the drum.

The surface of the drum 10 is prepared for use by alumina blasting its outer surface and thereafter providing that surface with a thin copper plating 16. Such surface treatment is necessary for the effective bonding of a coating of solder 17 which is sprayed onto the surface of the drum 10. The coating of solder 17 has a melting temperature of approximately 300° C. and a composition of 1.5% silver, 5% tin and 93.5% lead. Before the coating of solder 17 is applied to the surface of the drum the cutting grooves 15 are plugged with solder strips 18 to provide continuity at the drum surface.

Once the drum 10 is prepared for use it is mounted within a vacuum chamber 19 above an evaporator 20. The drum 10 is coupled to a drive unit 21 and the cooling assemblies 12 linked by pipes 14 to the temperature control unit 13.

As part of the evaporation process the chamber 19 is evacuated and the drive unit 21 activated to rotate the drum 10 at the required rate. By means of a radiant heater 22 the drum 10 is pre-heated to an operating temperature of 250° C. The drum 10 is filled with helium gas for cooling purposes and the evaporator 20 charged with the molten alloy 23 required for evaporation.

An electron beam from an electron beam gun 24 is directed onto the surface of the molten alloy 23 to generate alloy vapour which rises from the evaporator 20 and is deposited onto the coating of solder 17. The rate of alloy evaporation is such that a layer of alloy approximately 10 μm thick is deposited on the drum 10 for each rotation thereof. As the drum 10 rotates the surface of the deposit is mechanically worked by a peening device 25 which improves the micro-structure of the deposited alloy. The evaporation process is continued until the deposit is approximately 50 mm thick.

Heat generated by the evaporation process is removed from the drum 10 by the cooling assemblies 12. The rate of heat transfer and hence the drum temperature is controlled by varying the pressure of the helium gas within the drum 10. Since the mass of the drum 10 is high the temperature at the deposition surface can be maintained at a substantially constant temperature of 250° C. and alloy vapour deposited thereon is rapidly cooled.

When the evaporation process is complete the electron beam gun 24 is switched off and the upper section of the vacuum chamber 19 removed. A rotary cutter, (not shown), arranged to traverse the length of the drum is positioned above the drum 10 and the drum rotated until one of the cutting grooves 15 is coincident with the line of travel of the cutter. The cutter is then lowered so that its depth of cut is almost to the base of the cutting groove 15. The cutter is set in motion and the deposited alloy is eventually cut into six discreet and equally sized arcuate plates by repetition of the cutting procedure along the remaining five cutting grooves 15.

The arcuate plates are removable from the collector drum 10 by heating of the deposited alloy with the radiant heater 22 to a temperature slightly in excess of 300° C. whereupon the solder 17 bonding coat becomes molten thereby releasing the deposited alloy from the collector drum 10 for further processing.

Once all the deposited alloy has been removed the drum 10 may be cooled and prepared for re-use by removing and replacing the damaged solder strips and re-spraying with a further coating of solder.

Figure 3:
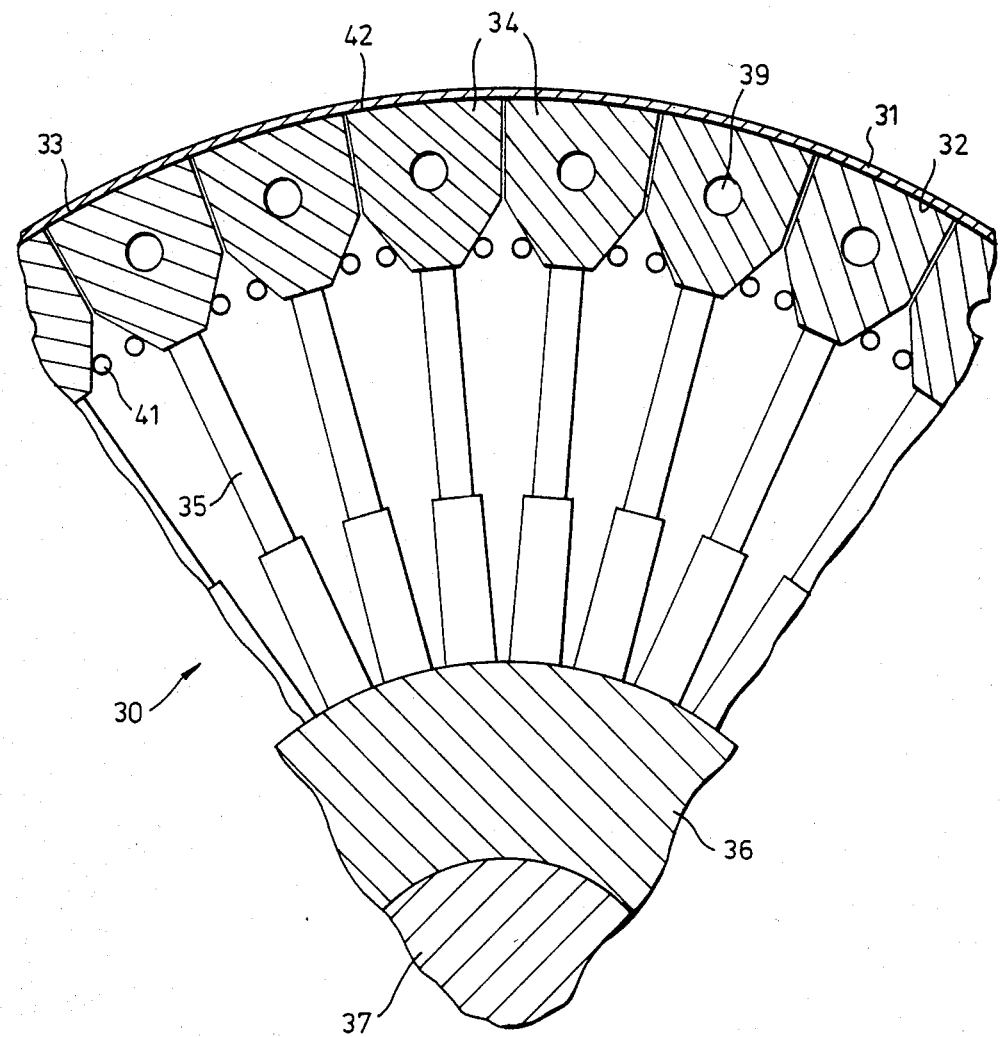
FIG. 3 shows a partial schematic radial section of a modified drum structure.
Figure 4:
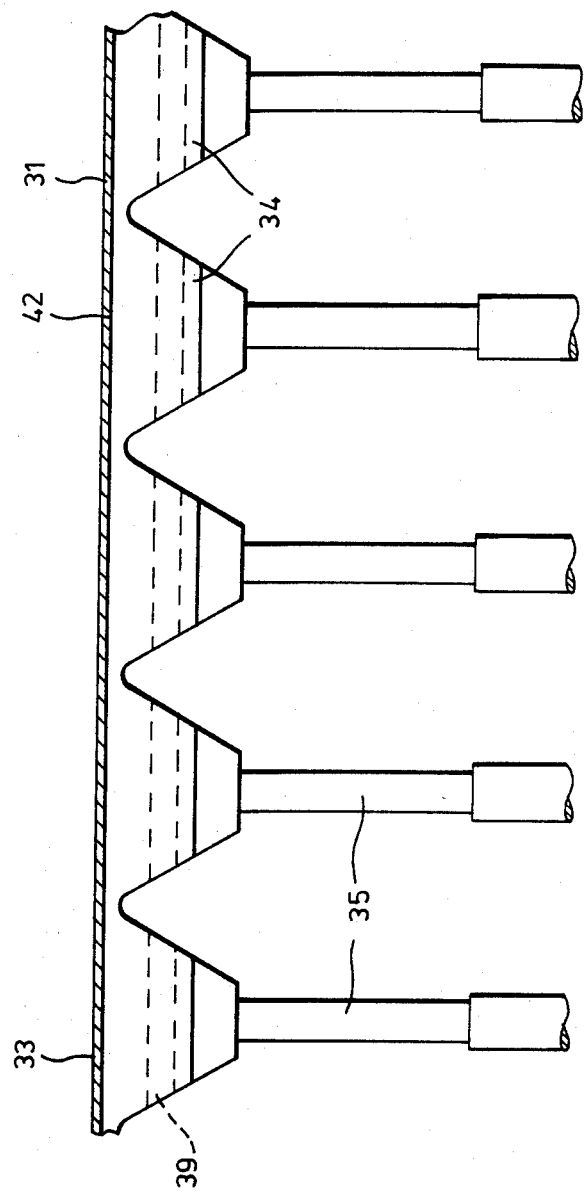
FIG. 4 shows an axial view of one of the axial bars and support spokes of the FIG. 3 drum structure.

In a modification of the invention as shown in accompanying FIGS. 3 and 4, the outer skin 31 of the collector drum 30 is fabricated from a thin sheet of aluminium based material and the inner surface of the fabricated skin is coated with copper, by for example, electroplating. The copper plating facilitates wetting of the skin inner surface by a subsequently applied solder coating 33, applied by a spraying process or, becaue of the much lower thermal capacity of the thin skin, by conventional dipping in a solder bath.

Immediately below the thin cylindrical skin 31 of the collector the main drum periphery structure comprises a plurality of axial bars 34 formed, for example, by machining aluminium alloy extrusions. Each axial bar is machined such as to allow a close sliding fit between itself and each of its immediate neighbours. Each axial bar 34 is mounted on a plurality of spokes 35 extending radially and along the length of a central hub 36 and shaft 37 arrangement. Each axial bar 34 is adjustably and resiliently mounted on its own set of spokes 35 by, for example, a screw thread and coil or disc spring arrangement (not shown) such that each bar 34 is allowed a limited degree of radial movement in either direction from its normal position. Moreover, each axial bar 34 is so machined such that multiple radial flexure in either direction is permitted simultaneously within a single axial bar 34.

Each axial bar 34 may be provided with holes 39 in which rod heaters may be inserted, although of course the radiant heater 22 above the drum assembly referred to above in FIG. 1 may be used for initial heating of the collector at process startup. Additionally each axial bar 34 is provided with attachment points (not shown) to which cooling pipes, for example, may be clamped.

Each axial bar 34, is electroplated with copper and that area of each bar which forms a portion of the outer surface of the assembled bars 34 is coated with solder 42, preferably by a spraying process.

When all the axial bars 34 are assembled on the spoke 35 array the outer surface defined by the assembly is a cylinder.

The thin outer skin 31 precoated on its inner surface 32 with copper and solder 33, is positioned over the axial bar drum assembly and the screw thread and spring arrangement (not shown) is adjusted such that each axial bar 34 bears with substantially equal pressure resiliently against the outer skin 31. The outer skin 31 is heated by the radiant heater (see numeral 22 in FIG. 1) within the process apparatus whilst the drum is rotating, eventually reaching a temperature whereby the solder coating 33 within the outer skin 31 and the solder coating 42 on the axial bars 34 are caused to fuse together. Alternatively the drum can be heated from the interior by the rod heaters and achieve the same result. The drum assembly 30 is allowed to cool so that the molten solder interface solidifies thus resulting in the outer skin 31 being bonded to the inner drum structure formed by the axial bars 34.

The resulting drum has a conformable surface which is thus able to accommodate minor movements of the deposited alloy due to thermal and mechanical stresses without rupture of the solder interface layer.

It will be realised that the deposited alloy need not be detached from the drum in-situ and that the drum may be removed from the vacuum chamber so that an already prepared drum can be installed, thus reducing the down-time of the process to a minimum.

Although the invention of using a solder interface has been described with respect to a drum collector it is equally applicable to a slab type collector.

What is claimed is:

1. A reusable collector for use in a process for the production of an alloy layer by deposition thereof from the vapour phase, the collector comprising:
    a thin outer cylindrical skin having an outer surface which defines a deposition surface;
    a main drum structure comprising a plurality of axial bars arranged to accommodate thermal and/or mechanical stresses;
    resilient support means axially and adjustably carrying said axial bars;
    an alloy between said main drum structure and said outer cylindrical skin, wherein
    said alloy consists of a solder alloy having a melting temperature at which the onset of fusion occurs above the peak operating temperature at said deposition surface, said alloy being meltable upon completion of deposition from the vapour phase to detach said deposited alloy layer and said outer cylindrical outer skin from said main drum structure.

2. A reusable collector as claimed in claim 1 and wherein:
said solder alloy is a lead based eutectic consisting essentially of, in weight percent, 1.5% silver, 5.0% tin, with the remainder being lead.

3. A reuseable collector as claimed in claim 1 and wherein
a first coating of a metal to facilitate wetting by a subsequently applied coating of said solder alloy is on said deposition surface.

4. A reuseable collector as claimed in claim 3 and wherein
said first coating metal is copper.

5. A reuseable collector as claimed in claim 1 and wherein
said solder alloy coating is applied by a spraying process.

6. A reuseable collector as claimed in claim 1 and wherein
said plurality of axial bars comprising said main drum structure are each formed from aluminium alloy extrusions.

7. A reuseable collector as claimed in claim 6 and wherein
at least the area of each of said axial bars comprising said main drum structure to be subsequently coated with said solder alloy is first copper plated.

8. A reuseable collector as claimed in claim 1 and wherein
a first coating of copper is on the inner surface of said outer cylindrical skin.

9. A reuseable collector as claimed in claims 1, 6, 7 or 8 and wherein
a solder alloy coating is on either or both of said inner surface of said outer cylindrical skin and the outer surface of said main drum structure prior to assembly of said outer cylindrical skin onto said main drum structure.

10. A reuseable collector as claimed in claim 1 and wherein
said deposition surface has at least one axial groove.

11. A reuseable collector as claimed in claim 10 and wherein
said at least one groove in said deposition surface is filled with solder alloy.

12. A reuseable collector as claimed in claim 1 and having
heaters and coolers.

* * * * *